(12) United States Patent
Lee (10) Patent No.: US 9,741,771 B2
(45) Date of Patent: Aug. 22, 2017

(54) METHOD FOR MANUFACTURING ORGANIC LIGHT EMITTING DIODE DISPLAY

(71) Applicant: SAMSUNG DISPLAY CO., LTD., Yongin, Gyeonggi-Do (KR)

(72) Inventor: Kang-Yong Lee, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 160 days.

(21) Appl. No.: 14/475,933

(22) Filed: Sep. 3, 2014

(65) Prior Publication Data

US 2015/0064819 A1    Mar. 5, 2015

(30) Foreign Application Priority Data

Sep. 4, 2013 (KR) .................. 10-2013-0106239

(51) Int. Cl.
*H01L 27/32* (2006.01)
*H01L 51/56* (2006.01)

(52) U.S. Cl.
CPC .......... *H01L 27/3223* (2013.01); *H01L 51/56* (2013.01); *H01L 2227/323* (2013.01); *H01L 2227/326* (2013.01)

(58) Field of Classification Search
None
See application file for complete search history.

(56) References Cited

U.S. PATENT DOCUMENTS

| | | | | |
|---|---|---|---|---|
| 6,485,596 B1* | 11/2002 | Toyoda | ................. | B29C 31/006 156/230 |
| 8,043,936 B2* | 10/2011 | Eguchi | .............. | H01L 21/67092 257/E21.237 |
| 2001/0007682 A1* | 7/2001 | Chiu | ..................... | B29C 33/303 425/127 |
| 2001/0053648 A1* | 12/2001 | Furukawa | ............... | B32B 17/06 445/24 |
| 2002/0017864 A1* | 2/2002 | Watanabe | ............... | C03B 19/06 313/586 |
| 2003/0044727 A1* | 3/2003 | Park | ....................... | G03F 7/0007 430/320 |
| 2003/0211333 A1* | 11/2003 | Watanabe | ................. | B32B 7/02 428/422.8 |
| 2008/0113486 A1* | 5/2008 | Eguchi | .................. | B32B 43/006 438/458 |
| 2008/0128694 A1* | 6/2008 | Arita | .................... | H01L 21/6835 257/48 |
| 2012/0056530 A1 | 3/2012 | Yee | | |
| 2012/0256534 A1* | 10/2012 | Lee | ...................... | H01L 51/5253 313/504 |

(Continued)

FOREIGN PATENT DOCUMENTS

KR    10-2007-0013127 A    1/2007
KR    10-2012-0023897 A    3/2012

*Primary Examiner* — Brett Feeney
*Assistant Examiner* — Erik T Peterson
(74) *Attorney, Agent, or Firm* — Lee & Morse, P.C.

(57) ABSTRACT

A manufacturing method of an organic light emitting device may include the following. A panel displaying an image is formed. A buffering member including a dummy buffering member is adhered to the panel. A film is adhered to an upper surface of the buffering member. The film and the dummy buffering member are removed.

20 Claims, 7 Drawing Sheets

(56) References Cited

U.S. PATENT DOCUMENTS

2014/0332150 A1* 11/2014 Hirakata .............. B32B 38/10
  156/247
2015/0060933 A1*  3/2015 Ohno ................ H01L 51/5237
  257/99

* cited by examiner

METHOD FOR MANUFACTURING ORGANIC LIGHT EMITTING DIODE DISPLAY

CROSS-REFERENCE TO RELATED APPLICATION

Korean Patent Application No. 10-2013-0106239, filed on Sep. 4, 2013, in the Korean Intellectual Property Office, and entitled: "Method For Manufacturing Organic Light Emitting Diode Display," is incorporated by reference herein in its entirety.

BACKGROUND

1. Field

Embodiments relate to a manufacturing method of an organic light emitting device.

2. Description of the Related Art

An organic light emitting diode (OLED) display is a flat panel display that can be lightweight and slim because it has a self-light emitting characteristic and does not require a separate light source. Because it shows characteristics such as low power consumption, high luminance, and high reaction speed, it is receiving attention as the next generation display device. An OLED display may include a panel assembly forming an organic light emitting diode. The organic light emitting diode may include an anode, a cathode, and an organic emission layer. Holes and electrons may be injected from the anode and cathode to form excitons, which emit light while transiting to a ground state.

SUMMARY

A manufacturing method of an organic light emitting device may include the following. A panel displaying an image is formed. A buffering member including a dummy buffering member is adhered to the panel. A film is adhered to an upper surface of the buffering member. The film and the dummy buffering member are removed. After adhering the buffering member, an upper portion of the film may be pressed in a panel direction by using a roller. Before adhering the buffering member, a buffer layer may be formed on the panel. The buffering member may include a urethane-based or acryl-based material. The film may include polyethylene terephthalate (PET). A density of the buffering member may be the same or different according to positions thereof. An adhesive may be coated on one surface of the buffering member facing the panel, and the adhesive may be coated on a contact portion of the dummy buffering member with the film.

The buffering member may be formed as dual layers including a first buffering member and a second buffering member. The first buffering member may include a first dummy buffering member. The second buffering member may include a second dummy buffering member. The second buffering member may be adhered to the upper surface of the first buffering member. The film may be adhered to the upper surface of the second buffering member. The first buffering member and the second buffering member may include the same material and/or different materials. The first buffering member and the second buffering member may have the same height and formation position, and/or different heights and formation positions. The first dummy buffering member and the second dummy buffering member may be adhered to each other, and the dummy buffering member may be adhered to the film to be removed. The buffering member may include two or more layers.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. When a layer or element is referred to as being "on" another layer or substrate, it can be directly on the other layer or substrate, or intervening layers may also be present. When a layer is referred to as being "under" another layer, it can be directly under, and one or more intervening layers may also be present. When a layer is referred to as being "between" two layers, it can be the only layer between the two layers, or one or more intervening layers may also be present. Like reference numerals refer to like elements throughout.

Figure 1:
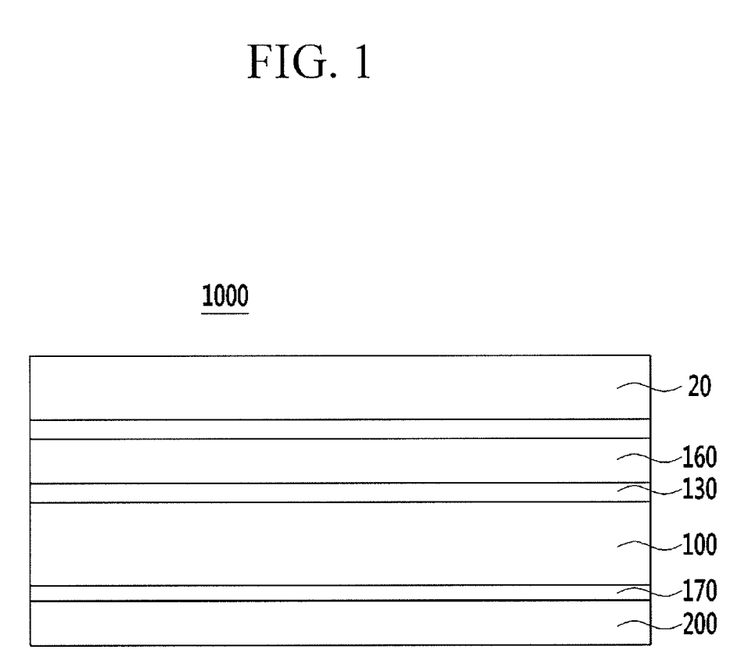
FIG. 1 schematically illustrates a cross-sectional view of an organic light emitting device.

FIG. 1 illustrates a schematically cross-sectional view of an organic light emitting device 1000. Referring to FIG. 1, the organic light emitting device 1000 may include a panel 100 combined with a sealing member, a buffer layer 170, a buffering member 200, a polarization member 130, a resin layer 160, and a window 20. The organic light emitting device 1000 may further include a printed circuit board (PCB) supplying a driving signal to the panel 100 and a flexible circuit board connecting the panel 100 and the printed circuit board (PCB).

The buffering member 200 may include a urethane-based material and an acryl-based material and protects the panel 100 from an external impact. For example, the buffering member 200 may be made of a sponge formed by foaming and molding urethane-based and acryl-based materials. A graded density of the buffering member 200 may be controlled according to foaming and molding conditions and a material ratio. As the density of the buffering member 200 is increased, an impact may be more quickly absorbed. Further, if the density of the buffering member 200 is decreased, for example, an impact absorption force may be high. A buffering member 200 having low density may be appropriate for absorbing a large impact.

For adhering with the panel 100, an adhesive may be coated on one surface of the buffering member 200. The thickness of the buffering member 200 may be uniform. The buffering member 200 may be formed of at least two layers according to a structure of a supporting structure of the panel. Also, for a buffering member 200 of a single layer or multiple layers, the height or formation position of each layer structure of the buffering member 200 may be mutually different.

In the buffering member 200, the density of an edge may be higher than the density of the center. The edge of the buffering member 200 may be disposed at a position corresponding to a portion of a non-display region near a display region, and the center of the buffering member 200 may be disposed at a position corresponding to the display. The density of the buffering member 200 may be changed while having a concentration gradient or while having a clearly distinguished boundary. The buffering member 200 having higher density on the side may be disposed at the portion where the sealing member is formed. The sealing member may be a glass or a resin such that the buffering member 200 having high density may effectively and quickly absorb the impact at the portion where the sealing member is disposed, thereby improving mechanical strength. In other implementations, the buffering member 200 having the low density may be disposed on the portion corresponding to the display region such that the impact absorption force for the display region may be increased.

The buffer layer 170 may be formed on the buffering member 200. The buffer layer 170 may be formed to prevent the buffering member 200 and inner structures of an electronic device that may be inside the buffering member 200 in the organic light emitting device 1000 from reflecting and the shape of the inner structures from being transmitted and recognized outside. The buffer layer 170 may be formed of an opaque material and may have a black color.

The polarization member 130 may be between the panel 100 and the resin layer 160 to suppress reflection of external light by the panel 100. The polarization member 130 may be an absorption polarization member. The polarization member 130 may control an amount of light source light of a backlight unit (BLU) by using the polarization characteristic of the light, and may be used for improving an optical characteristic of the panel 100, the planarization member 130 may be selectively omitted if desired.

The resin layer 160 may include a transparent material such as glass or plastic, and may be hardened by ultraviolet rays (UV) irradiated from a UV ray lamp. The resin layer 160 may adhere the cover window 20 to the polarization member 130 thereby stably fixing the cover window 20, reducing the reflection of the light by a difference of refractive index, and/or smoothing the external impact.

The window 20 may include a base film and a coating layer. The base film may include polyethylene terephthalate (PET), triacetyl cellulose (TAC), polyimide (PI), polycarbonate (PC), thermoplastic polyurethane (TPU), or silicon rubber. The coating layer may be coated on the base film. The coating layer may include portions having different hardness. The coating layer may be an acryl-based hard coat or an organic/inorganic hybrid hard coat.

Figure 2:
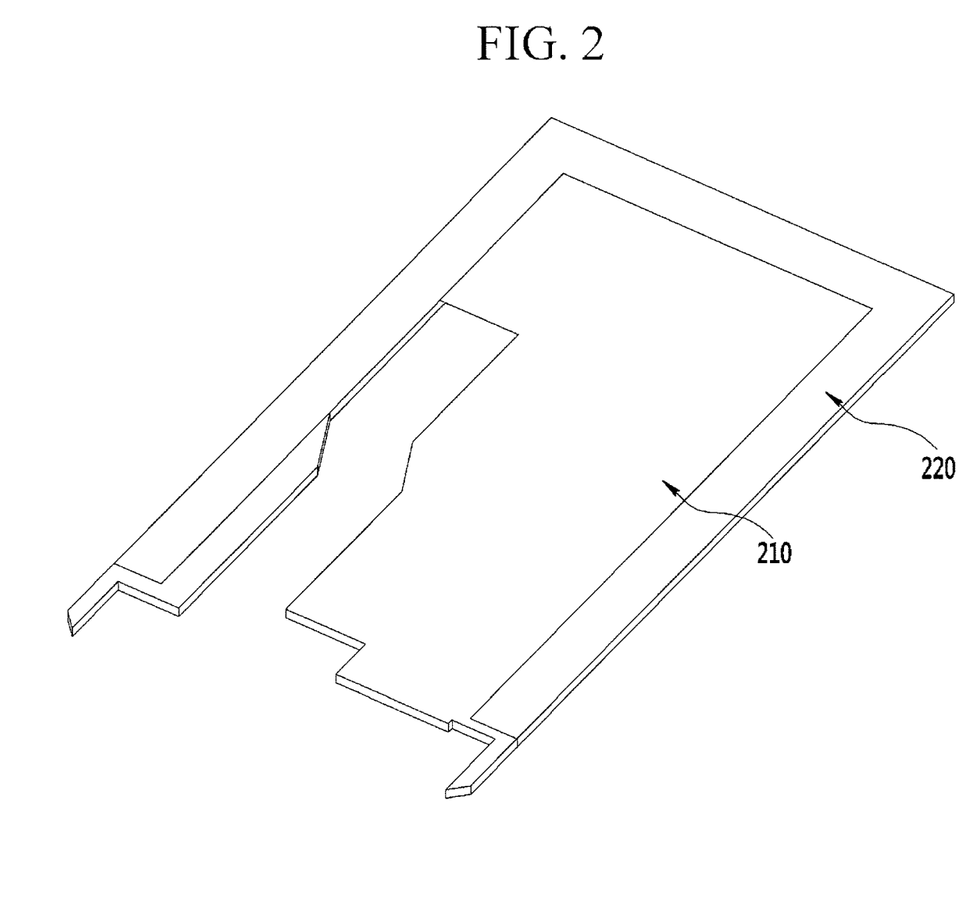
FIG. 2 illustrates a perspective view of a multi-cushion.

Next, referring to FIG. 2, a structure of the buffering member 200 of the organic light emitting device 1000 is described. FIG. 2 illustrates a perspective view of the buffering member 200. Referring to FIG. 2, the buffering member 200 may be formed of two layers or more according to the structure of the panel supporting structure of the device. When the buffering member 200 includes a second buffering member 220 and a first buffering member 210, for example, the height or the formation position of the each layer structure of the buffering member 200 may be mutually different. A portion where the multi-buffering member of FIG. 2 is not disposed may have a structure to be connected to a PCB/FPC for driving the panel 100.

The buffering member 200 may be formed of multiple layers such as two, three, four, or more layers, thereby smoothing the impact against the panel 100 for the various shapes of structures and fixing the panel 100. The buffering member 200 may include the urethane-based and acryl-based materials and may protect the panel 100 from external impact. For example, the buffering member 200 may be made of a sponge formed by foaming and molding the urethane-based and acryl-based materials. Further, a graded density of the buffering member 200 may be controlled according to foaming and molding conditions and a material ratio. As the density of the buffering member 200 is increased, the impact may be more quickly absorbed. Further, if the density of the buffering member 200 is decreased, the impact absorption force may be higher. A buffering member 200 having low density may be appropriate for absorbing a large impact. For the adhering with the panel 100, an adhesive may be coated on one surface of the buffering member 200.

Figure 3:
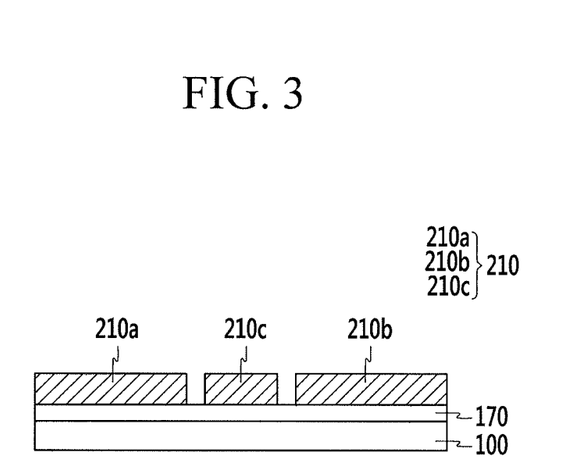
FIG. 3 to FIG. 6 illustrate views showing stages of a manufacturing process of a buffering member of an organic light emitting device.

Next, referring to FIG. 3 to FIG. 6, an adhering method of the buffering member 200 of the organic light emitting device 1000 is described. FIG. 3 to FIG. 6 illustrate views showing a manufacturing process of a buffering member of an organic light emitting device. Referring to FIG. 3, a buffer layer 170 may be attached to the panel 100 of the organic light emitting device 1000, and first buffering members 210a, 210b, and 210c may be attached. The buffer layer 170 may be formed on the upper surface of the panel 100 and may be adhered to an adhesion portion of the panel 100 by using the adhesive. The buffering member 200 may be a buffering member including the dual layer and the first buffering member 210 may be adhered on the buffer layer 170.

The first buffering member 210 may include urethane-based and/or acryl-based materials and may protect the panel 100 from an external impact. For example, the first buffering member 210 may be formed of the formed and molded sponge of the urethane-based and acryl-based material. Further, the graded density of the first buffering member 210 may be controlled according to the foaming and molding conditions and the material ratio. The first buffering member 210 may include buffering members 210a and 210b that serve as the buffer in the organic light emitting device 1000, and a dummy buffering member 210c that will be removed later, as described below. The first buffering member 210 may be adhered in a cut state with respect to the dummy buffering member 210c and the buffering members 210a and 210b, which may be separated before being adhered to the buffer layer 170.

Figure 4:
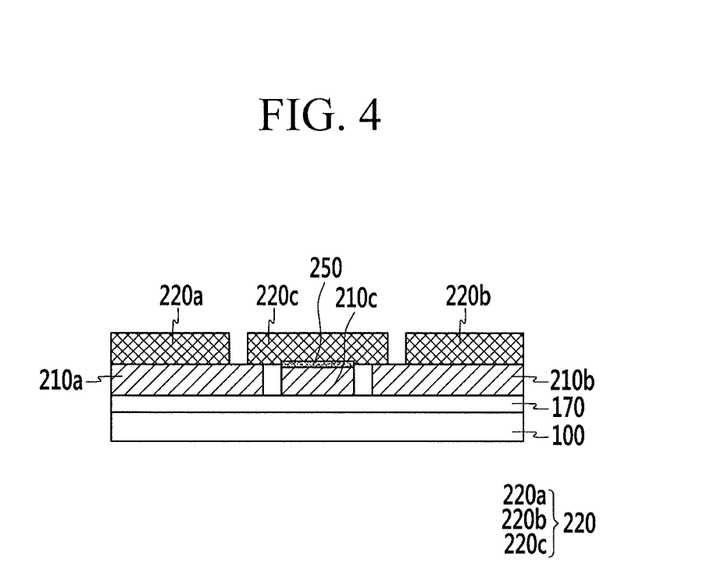

Next, referring to FIG. 4, second buffering members 220a, 220b, and 220c may be adhered on the upper surface of the first buffering member 210 of the panel 100 of the organic light emitting device 1000 formed with the first buffering member 210 of FIG. 3. The second buffering member 220 may include urethane-based and/or acryl-based material and may protect the panel 100 from external impact. For example, the second buffering member 220 may include a sponge formed by foaming and molding the urethane-based and/or acryl-based material. The graded density of the second buffering member 220 may be controlled according to the foaming and molding conditions and the material ratio. The second buffering member 220 may use the same material as the first buffering member 210 and/or a different material.

The second buffering member 220 may be adhered on the upper surface of the first buffering member 210 of the buffer layer 170. The second buffering member 220 may include the buffering members 220a and 220b that remain in the organic light emitting device 1000, and a dummy buffering member 220c that is removed later as described below. The second buffering member 220 may be adhered in the cut state with respect to the dummy buffering member 220c and the buffering members 220a and 220b, which may be separated before being adhered to the upper surface of the first buffering member 210 on the buffer layer 170.

The height and the formation position of the first buffering member 210 and the second buffering member 220 may be different according to the structure of the panel supporting structure of the device mounted with the display panel. The shape and the size of the dummy buffering members 210c and 220c may be variously formed. In FIG. 4, for example, one example of the size of the dummy buffering members 210c and 220c of the first buffering member 210 and the second buffering member 220 is illustrated. In other implementations, the dummy buffering members 210c and 220c and the first buffering member 210 and the second buffering member 220 according thereto may have various other shapes.

An adhesive 250 may be used under the first buffering member 210 and the second buffering member 220 to adhere with the buffer layer 170 with the lower layer of each member of the first buffering member 210. An example of the organic light emitting device 1000 including the buffering member 200 formed of the dual layer is described. In other implementations, the buffering member 200 may be formed of a single layer or more than two layers.

Figure 5:
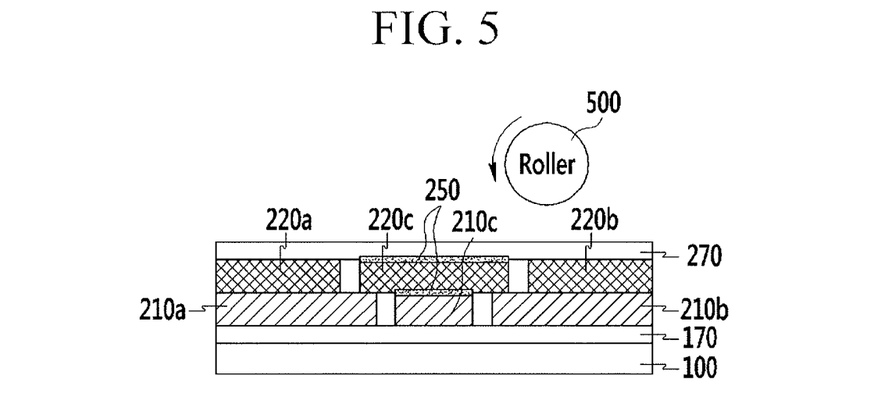

Referring to FIG. 5, a film 270 may be adhered to the upper surface of the second buffering member 220 of the panel 100 of the organic light emitting device 1000 including the first buffering member 210 and the second buffering member 220 of FIG. 4. The film 270 may be disposed close to the upper surface of the second buffering member 220, and the dummy buffering member 220c of the second buffering member and the film 220 may be adhered by the adhesive 250 on the dummy buffering member 220c of the second buffering member 220c. The film 270 as an element that may be removed along with the dummy buffering member 210 of the first buffering member 210 and the second buffering member 220 from the organic light emitting device 1000 may be, for example, PET. After adhering the film 270, the film 270 may be pressed by using a roller 500 to completely contact the first buffering member 210, the second buffering member 220, and the film 270 formed on the upper surface of the panel 100 of the organic light emitting device 1000 in order to not generate or minimize bubbles between each layer and the panel 100.

Figure 6:
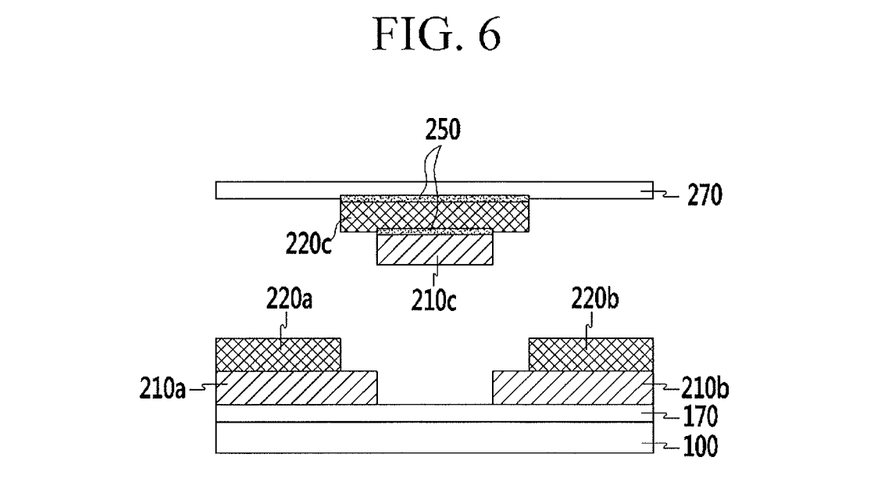

Next, referring to FIG. 6, among the first buffering member 210, the second buffering member 220, and the film 270 completely pressed and contacted with the panel 100 in FIG. 5, the film 270 may be separated from the panel 100 of the organic light emitting device 1000. The dummy buffering members 210c and 220c of the first buffering member 210 and the second buffering member 220 may be adhered to the film 270 by the adhesive 250, and may be completely separated from the panel 100 and the organic light emitting device 1000 formed, for example, when the buffering member 200 is completed.

To form the buffering member 200 in the panel 100 of the organic light emitting device 1000, when simultaneously pressing the panel 100, the buffer layer 170, and the buffering member 200, for example, by using the roller 500 after forming the buffer layer 170 and the buffering member 200, the buffer layer 170 at the position where the buffering member 200 is not formed may be difficult to completely press by the roller 500. Bubbles may be easily generated between the buffer layer 170 and the panel 100. To prevent the generation of the bubbles, the buffer layer 170 may be formed on the upper surface of the panel 100 and may be completely pressed by using the roller 500, and the buffering member 200 may be formed. The buffering member 200 may be formed of the multi-layered structure according to the supporting structure of the panel 100, and in this case, for example, an adhering process may be separately used for each of buffering member 200 such that the number of processes may be increased. When the multi-layers of the buffering member 200 are sequentially formed, for example, a misalignment may be generated outside the buffering member 200.

After previously forming the dummy buffering members 210c and 220c among the buffering member 200, the buffering member 200 may be formed on part of or the entire surface of the panel 100. The film 270 may be adhered on the upper surface of the dummy buffering members 210c and 220c by using the adhesive 250. The one press process may be performed by using the roller 500 such that the buffering member 200 may be easily formed through a simple process on the panel 100 without bubble generation and additional processes. The misalignment of the buffering member 200 may also be prevented.

Figure 7:
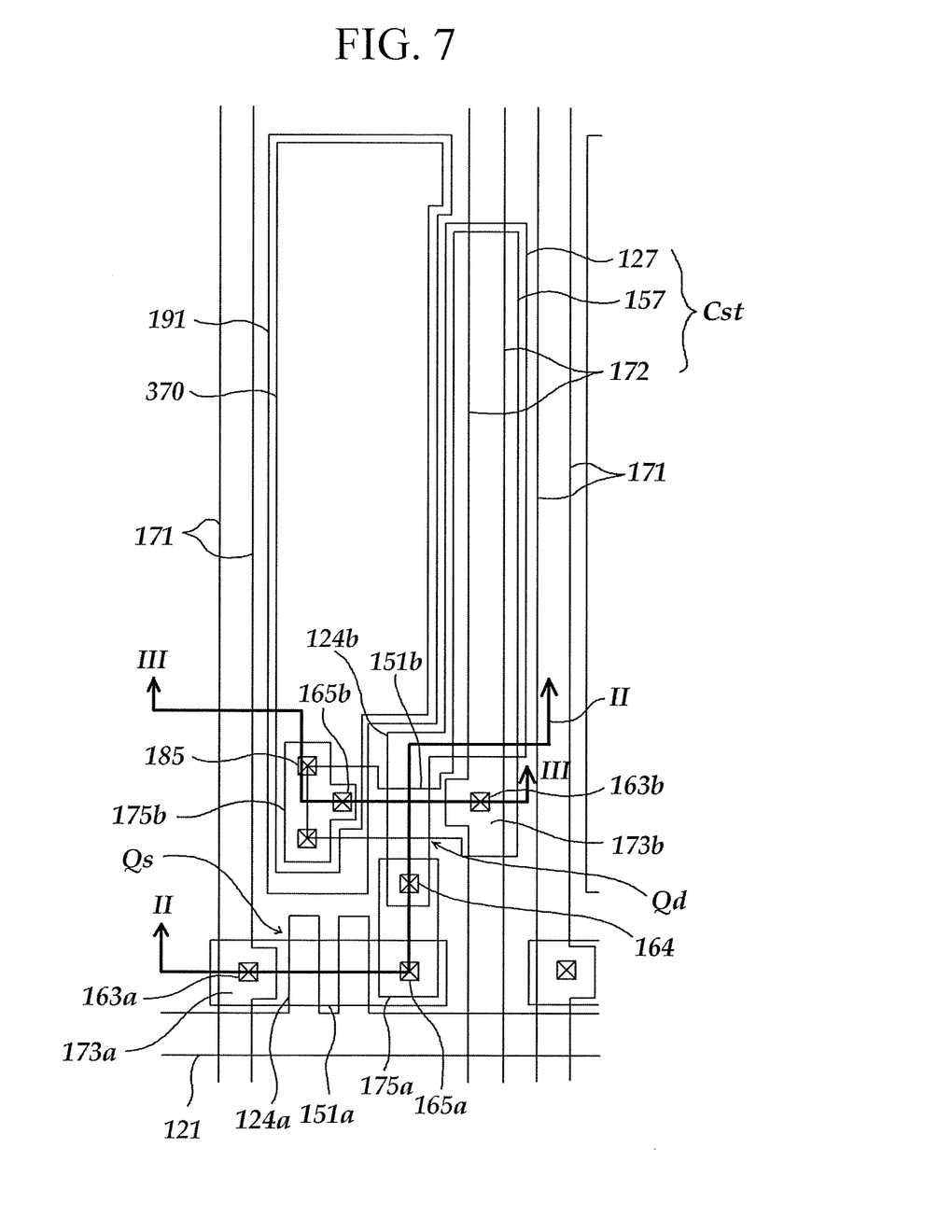
FIG. 7 illustrates a layout view of an organic light emitting device.
Figure 8:
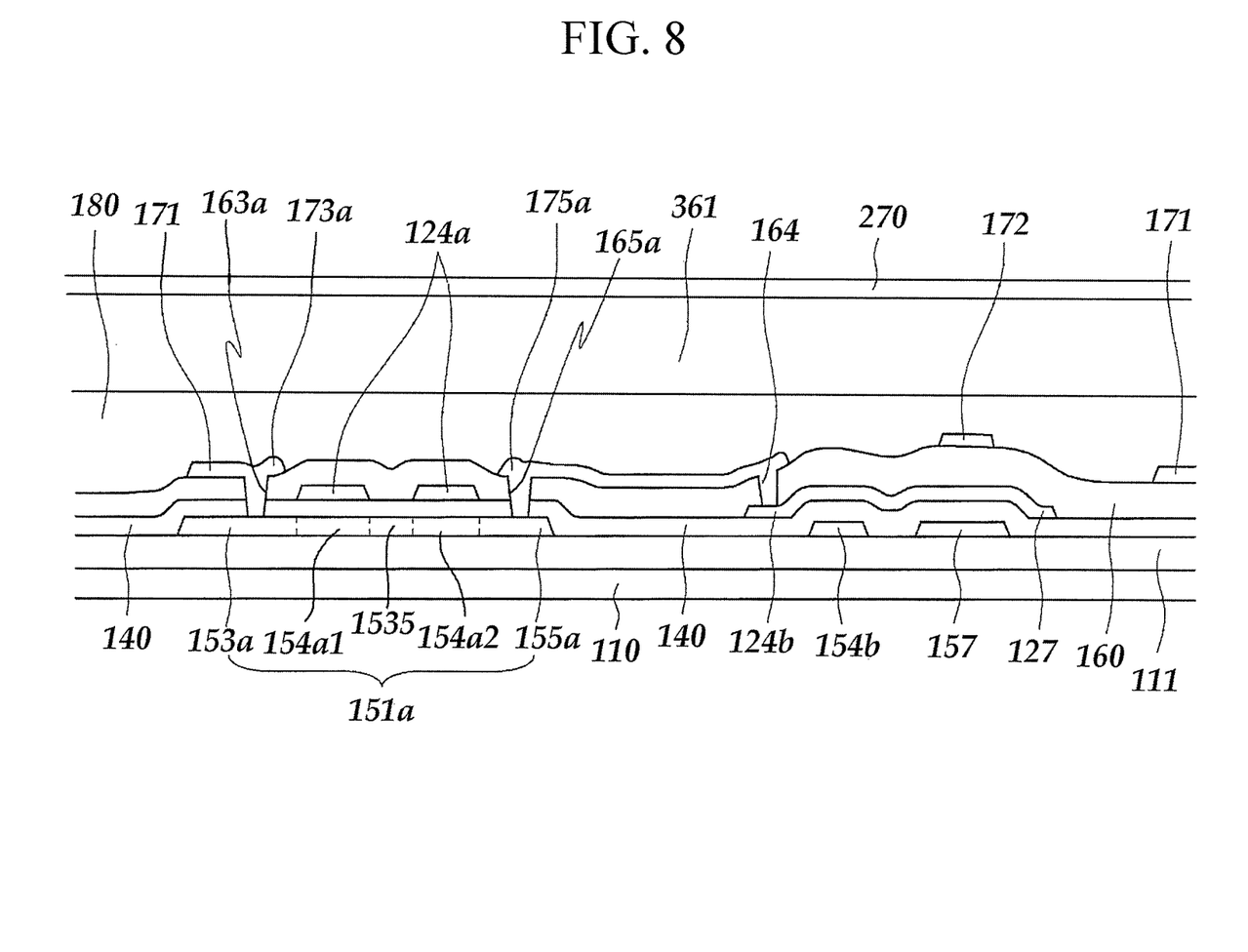
FIG. 8 illustrates a cross-sectional view of the organic light emitting device of FIG. 7 taken along the line II-II.
Figure 9:
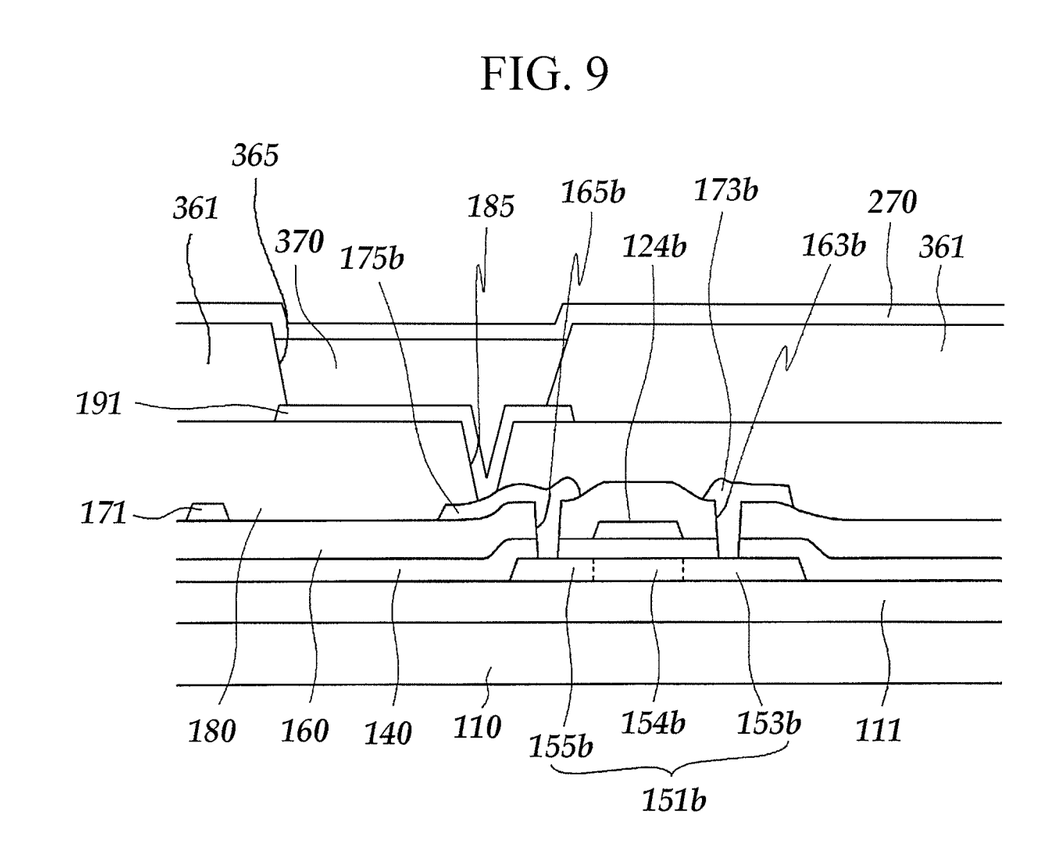
FIG. 9 illustrates a cross-sectional view of the organic light emitting device of FIG. 7 taken along the line III-III.

An organic light emitting panel 100 of an organic light emitting device 1000 is described with reference to FIG. 7 to FIG. 9. FIG. 7 illustrates a layout view of an organic light emitting device. FIG. 8 illustrates a cross-sectional view of the organic light emitting device of FIG. 7 taken along the line II-II. FIG. 9 illustrates a cross-sectional view of the organic light emitting device of FIG. 7 taken along the line III-III.

A blocking layer 111 made of a silicon oxide or silicon nitride may be formed on a substrate 110 made of transparent glass. The blocking layer 111 may have a dual-layered structure. A plurality of pairs of first and second semiconductor islands 151a and 151b that may be made of polysilicon may be formed on the blocking layer 111. The semiconductor islands 151a and 151b may respectively include a plurality of extrinsic regions including conductive impurities of an n-type or a p-type, and at least one intrinsic region that does not include conductive impurities.

In the first semiconductor island 151a, the extrinsic region may include first source and drain regions 153a and 155a and an intermediate region 153S. These may be doped with an n-type impurity and separated from each other. The intrinsic region may include a pair of first channel regions 154a1 and 154a2 between the extrinsic regions 153a, 153S, and 155a. In the second semiconductor island 151b, the extrinsic region may include second source and drain regions 153b and 155b. These may be doped with a p-type impurity and may be separated from each other. The intrinsic region may include a second channel region 154b between the second source and drain regions 153b and 155b and a storage region 157 extending from the second drain region 153b upward.

The extrinsic region may further include lightly doped regions between the channel regions 154a1, 154a2, and 154b, and the source and drain regions 153a, 155a, 153b, and 155b. The lightly doped regions may be formed at offset regions that do not include impurities. In other embodiments, the extrinsic regions 153a and 155a of the first semiconductor island 151a may be doped with p-type impurities, and the extrinsic regions 153b and 155b of the second semiconductor island 151b may be doped with n-type impurities. The conductive p-type impurity may be, for example, boron (B) or gallium (Ga), and the conductive impurity of the n-type may be phosphorus (P) or arsenic (As).

A gate insulating layer 140 made of, for example, a silicon nitride or silicon oxide may be formed on the semiconductor islands 151a and 151b and the blocking layer 111. A plurality of gate conductors including a plurality of gate lines 121 having a plurality of first control electrodes 124a and a plurality of second control electrodes 124b may be formed on the gate insulating layer 140. The gate lines 121 may transmit gate signals and may be substantially extended in the transverse direction. A first control electrode 124a may be extended upward from the gate line 121, thereby intersecting the first semiconductor island 151a, and particularly overlapping the first channel regions 154a1 and 154a2. Each gate line 121 may include an end portion having a large area for contact with another layer or an external driving circuit. When a gate driving circuit for generating gate signals is formed directly on the substrate 110, for example, the gate lines 121 may extend and be directly connected to the gate driving circuit. A second control electrode 124b may be separated from the gate line 121 and may overlap the second channel region 154b of the second semiconductor island 151b. The second control electrode 124b may be extended thereby forming a storage electrode 127. The storage electrode 127 may overlap the storage region 157 of the second semiconductor 151b.

The gate conductors 121 and 124b may be made of an aluminum-based metal of aluminum (Al) or aluminum alloys, a silver-based metal of silver (Ag) or a silver alloy, a copper-based metal of copper (Cu) or a copper alloy, a molybdenum-based metal of molybdenum (Mo) or a molybdenum alloy, chromium (Cr), tantalum (Ta), titanium (Ti), or the like. The control electrodes 124a and 124b may have a multi-layer structure including two conductive layers that have different physical properties from each other. One of the conductive layers may be formed using a metal having low resistivity, such as an aluminum-based metal, a silver-based metal, or a copper-based metal, in order to reduce signal delay or voltage drop. Other conductive layers may include a material having good physical, chemical, and electrical contact characteristics particularly with indium tin oxide (ITO) and indium zinc oxide (IZO), such as a molybdenum-based metal, chromium, tantalum, titanium, or the like. Examples of the combination may include a lower chromium film and an upper aluminum (alloy) film, and a lower aluminum (alloy) film and an upper molybdenum (alloy) film. In other implementations, the gate conductors 121 and 124b may be alternatively or additionally made of various other metals and/or conductors.

Side surfaces of the gate conductors 121 and 124b may be inclined to the surface of the substrate 110, and an inclination angle thereof may be, for example, from about 30° to about 80°. An interlayer insulating layer 160 may be formed on the gate conductors 121 and 124b. The interlayer insulating layer 160 may include an inorganic insulator such as a silicon nitride, a silicon oxide, and so on, an organic insulator, or an insulator having a low dielectric ratio. The dielectric constant of the insulator may be, for example, less than about 4.0, for example a-Si:C:O or a-Si:O:F compound, which may be formed through plasma enhanced chemical vapor deposition (PECVD). The interlayer insulating layer 160 may be made of an organic insulator having photosensitivity and may provide a flat surface.

The interlayer insulating layer 160 may have a plurality of contact holes 164 exposing the second control electrodes 124b. The interlayer insulating layer 160 and the gate insulating layer 140 may have a plurality of contact holes 163a, 163b, 165a, and 165b exposing the source and drain regions 153a, 153b, 155a, and 155b. A plurality of data conductors including data lines 171, driving voltage lines 172, and first and second output electrodes 175a and 175b may be formed on the interlayer insulating layer 160.

The data lines 171 may transmit data signals and extend in a longitudinal direction, thereby intersecting the gate lines 121. Each data line 171 may include a first input electrode 173a connected to the first source region 153a through the contact hole 163a, and may include an end portion having a large area for contact with another layer or an external driving circuit. When a data driving circuit for generating data signals is formed directly on the substrate 110, for example, the data line 171 may extend and be directly connected to the data driving circuit.

The driving voltage lines 172 may transmit a driving voltage and extend in a longitudinal direction, thereby intersecting the gate lines 121. Each driving voltage line 172 may include a plurality of second input electrodes 173b connected to the second source region 153b through the contact hole 163b. The driving voltage line 172 may overlap the storage electrode 127 and they may be connected to each other.

The first output electrode 175a may be separated from the data line 171 and the driving voltage line 172. The first output electrode 175a may be connected to the first drain region 155a through the contact hole 165a, and to the second control electrode 124b through the contact hole 164. The second output electrode 175b may be separated from the data line 171, the driving voltage line 172, and the first output electrode 175a, and may be connected to the second drain region 155b through the contact hole 165b.

The data conductors 171, 172, 175a, and 175b may include, for example, a refractory metal such as molybdenum, chromium, tantalum, and titanium, or alloys thereof, and may have a multi-layered structure including a refractory metal layer and a low resistance conductive layer. A multi-layered structure may include, for example, a dual layer of a chromium or molybdenum (alloy) lower layer and an aluminum (alloy) upper layer, and a triple-layer of a molybdenum (alloy) lower layer, an aluminum (alloy) middle layer, and a molybdenum (alloy) upper layer. In other implementations, the data conductor 171, 172, 175a, and 175b may be made of various other metals or conductors. Side surfaces of the data conductor 171, 172, 175a, and 175b may also be inclined to the surface of the substrate 110, and an inclination angle thereof may be about 30° to about 80° like the gate conductors 121 and 124b.

A passivation layer 180 may be formed on the data conductors 171, 172, 175a, and 175b. The passivation layer 180 may be made of an inorganic material, an organic material, or a low dielectric ratio insulating material. The passivation layer 180 may have a plurality of contact holes 185 exposing the second output electrodes 175b. The passivation layer 180 may have a plurality of contact holes exposing the end portions of the data lines 171, and the passivation layer 180 and the interlayer insulating layer 160 may have a plurality of contact holes exposing the end portions of the gate lines 121.

A plurality of pixel electrodes 191 may be formed on the passivation layer 180. The pixel electrodes 191 may be physically and electrically connected to the second output electrodes 175b through the contact holes 185, and may be made of a transparent conductive material such as ITO or IZO, or a reflective conductor such as silver, aluminum, or alloys thereof. A plurality of contact assistants or connecting members may be formed on the passivation layer 180 and may be connected to exposed ends of the gate lines 121 and the data lines 171.

Partitions 361 may be formed on the passivation layer 180. The partitions 361 may define a plurality of openings enclosing edges of the pixel electrodes 191, for example, like a bank, and may include an organic insulator or an inorganic insulator. The partitions 361 may include a photoresist including black pigments. The partitions 361 may serve as a light blocking member thereby simplifying the manufacturing process. An organic light emitting member 370 may be formed in openings 365 defined by the partitions 361 on the pixel electrode 191. The organic light emitting member 370 as an emission layer may include an organic material uniquely emitting light of one primary color such as of three primary colors of red, green, and blue.

A common electrode 270 may be formed on the organic light emitting member 370. The common electrode 270 may be applied with a common voltage Vcom, and may include a transparent conductive material such as ITO or IZO or a reflective metal including calcium (Ca), barium (Ba), aluminum (Al), magnesium (Mg), aluminum (Al), silver (Ag), or the like.

In the organic light emitting device, the first semiconductor island 151a, the first control electrode 124a connected to the gate line 121, the first input electrode 173a connected to the data line 171, and the first output electrode 175a may form a switching thin film transistor Qs. The channel of the switching thin film transistor Qs may be formed on the pair of first channel regions 154a1 and 154a2 of the first semiconductor island 151a. The second semiconductor island 151b, the second control electrode 124b connected to the first output electrode 175a, the second input electrode 173b connected to the driving voltage line 172, and the output electrode 175b connected to the pixel electrode may form the driving thin film transistor Qd. The channel of the driving thin film transistor Qd may be formed in the second channel region 154b of the second semiconductor island 151b. A pixel electrode 191, an organic light emitting member 370, and the common electrode 270 may form an organic light emitting element having the pixel electrode 191 as an anode and the common electrode 270 as a cathode, or vice versa. The storage electrode 127, and the driving voltage line 172 and storage region 157 that overlap each other via the organic light emitting member 370 interposed therebetween may form the storage capacitor Cst.

The switching thin film transistor Qs may transmit a data signal of the data line 171 in the response to a gate signal of the gate line 121. The driving thin film transistor Qd may flow a current having a magnitude depending on a voltage difference between the second control electrode 124b and the second input electrode 173b according to the data signal. The voltage difference between the second control electrode 124b and the second input electrode 173b may also be charged to the storage capacitor Cst and may be maintained after the switching thin film transistor Qs is turned off. The organic light emitting diode OLED may emit with a strength that changes according to the magnitude of the driving current, thereby displaying a corresponding image.

By way of summation and review, a panel assembly of an organic light emitting diode (OLED) display may be formed by attaching the upper substrate and lower substrate by using a sealing member. The panel assembly may be received in a bezel. The panel assembly of the OLED display may be formed having a structure in which a space is present therein, unlike a liquid crystal display (LCD) in which liquid crystal fills the inside of the panel assembly. The space may create weakness to external impact such as from falling and the like. When an external impact such as from falling and the like is applied to the organic light emitting diode (OLED) display, for example, the impact that is applied to the bezel may be directly transmitted to the panel assembly, such that the panel assembly may be easily broken. For example, a sealing member combining the upper substrate and the lower substrate may be formed of a material that is weak against tensile stress such that the sealing member may be easily damaged by the tensile stress applied to the sealing member according to a vibration of the upper substrate and the lower substrate, for example, when externally impacted. Therefore, there may be an issue of the upper substrate and lower substrate breaking, originating from breakage of the sealing member.

In the adhering method of the buffering member to the organic light emitting device described herein, compared with a process of adhering the buffering member to a general Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A manufacturing method of an organic light emitting device, comprising:
    forming a panel displaying an image;
    adhering a buffering member including an impact absorbing buffering member and a dummy buffering member to the panel such that a panel facing side of the impact absorbing buffering member is coplanar with a panel facing side of the dummy buffering member;
    attaching a film to a planar upper surface of the buffering member such that the film is in direct contact with the impact absorbing buffering member and the film is adhered to the dummy buffering member by an adhesive on a contact portion of the dummy buffering member between the film and the dummy buffering member; and
    removing the film and the dummy buffering member such that the impact absorbing buffering member remains on the panel.

2. The manufacturing method as claimed in claim 1, further comprising
    pressing an upper portion of the film in a panel direction by using a roller after attaching to the buffering member.

3. The manufacturing method as claimed in claim 2, further comprising
    forming a buffer layer on the panel before adhering the buffering member.

4. The manufacturing method as claimed in claim 1, wherein the film includes polyethylene terephthalate (PET).

5. The manufacturing method as claimed in claim 1, wherein the buffering member includes a urethane-based or acryl-based material.

6. The manufacturing method as claimed in claim 5, wherein:
- a density of the urethane-based or acryl-based material of the impact absorbing buffering member at one position thereof on the panel is the same as a density of the urethane-based or acryl-based material of the impact absorbing buffering member at another position thereof on the panel, or
- a density of the urethane-based or acryl-based material of the impact absorbing buffering member at one position thereof on the panel is different from a density of the urethane-based or acryl-based material of the impact absorbing buffering member at another position thereof on the panel.

7. The manufacturing method as claimed in claim 5, further comprising coating an adhesive on one surface of the buffering member facing the panel.

8. The manufacturing method as claimed in claim 5, wherein the buffering member is formed as dual layers including a first buffering member and a second buffering member, the first buffering member including a first dummy buffering member and a first impact absorbing buffering member, and the second buffering member including a second dummy buffering member and a second impact absorbing buffering member.

9. The manufacturing method as claimed in claim 8, wherein the second buffering member is adhered to the upper surface of the first buffering member.

10. The manufacturing method as claimed in claim 9, wherein the film is attached to the upper surface of the second buffering member.

11. The manufacturing method as claimed in claim 8, wherein the first buffering member and the second buffering member include the same material.

12. The manufacturing method as claimed in claim 8, wherein the first buffering member and the second buffering member include different materials.

13. The manufacturing method as claimed in claim 8, wherein:
- the first buffering member and the second buffering member have the same height, and
- a formation position of the second buffering member overlaps with a formation position of the first buffering member.

14. The manufacturing method as claimed in claim 13, wherein the first dummy buffering member and the second dummy buffering member are adhered to each other.

15. The manufacturing method as claimed in claim 8, wherein:
- the first buffering member and the second buffering member have different heights, and
- a formation position of the second buffering member is different from a formation position of the first buffering member such that a portion of the first buffering member is not overlapped by the second buffering member.

16. The manufacturing method as claimed in claim 15, wherein the first dummy buffering member and the second dummy buffering member are adhered to each other.

17. The manufacturing method as claimed in claim 1, wherein the buffering member includes two or more layers.

18. The manufacturing method as claimed in claim 8, wherein an upper surface of the second impact absorbing buffering member is coplanar with an upper surface of the second dummy buffering member prior to removing the film and the dummy buffering member.

19. The manufacturing method as claimed in claim 1, wherein adhering the buffering member includes aligning the dummy buffering member with a portion of the panel that displays an image.

20. A manufacturing method of an organic light emitting device, the method comprising:
- forming a panel displaying an image;
- adhering a buffering member including a dummy buffering member to the panel;
- adhering a film to an upper surface of the buffering member such that adhering the film includes coating an adhesive only on one surface of the dummy buffering member facing the panel and only on a contact portion of the dummy buffering member with the film; and
- removing the film and the dummy buffering member.

* * * * *